United States Patent [19]
Matsumoto

[11] Patent Number: 6,147,339
[45] Date of Patent: Nov. 14, 2000

[54] IMAGE SENSOR EMPLOYED FOR PORTABLE IMAGE INPUTTING DEVICE

[75] Inventor: Toshio Matsumoto, Tokyo, Japan

[73] Assignee: Mitsubishi Denki Kabushiki Kaisha, Tokyo, Japan

[21] Appl. No.: 09/160,793

[22] Filed: Sep. 25, 1998

[30] Foreign Application Priority Data

Mar. 30, 1998 [JP] Japan .................................. 10-084438

[51] Int. Cl.⁷ .............................. H01L 27/14; H04N 1/04
[52] U.S. Cl. ........................ 250/208.1; 358/474; 358/497
[58] Field of Search .................... 250/208.1, 216, 250/239; 358/471, 473, 474, 482, 484, 496, 497, 498; 235/472.01

[56] References Cited

U.S. PATENT DOCUMENTS

| | | |
|---|---|---|
| 5,038,027 | 8/1991 | Ioka . |
| 5,182,445 | 1/1993 | Yamashita . |
| 5,357,099 | 10/1994 | Tabata et al. ......................... 250/208.1 |
| 5,841,128 | 11/1998 | Shibuya et al. ....................... 250/208.1 |
| 5,965,870 | 10/1999 | Tabata .................................. 250/208.1 |

FOREIGN PATENT DOCUMENTS 520461  3/1993  Japan .

*Primary Examiner*—Seungsook Ham
*Assistant Examiner*—Kevin Pyo
*Attorney, Agent, or Firm*—Rothwell, Figg, Ernst & Manbeck, P.C.

[57] ABSTRACT

In an image sensor according to the present invention, a frame comprising a line light source, a light receiving element, and an original copy positioning member contacted to the original copy for positioning it being attached to a handy scanner housing. A transparent plate for passing the light emitted from the line light source and the reflected light from the original copy being attached to a frame so as to face the original copy. The transparent plate is further attached to the frame without any adhesive by being engaged with engaging portions of the frame.

19 Claims, 14 Drawing Sheets

IMAGE SENSOR EMPLOYED FOR PORTABLE IMAGE INPUTTING DEVICE

BACKGROUND OF THE INVENTION

1. Field of the Invention

The present invention relates to an image sensor employed for portable image inputting devices or the like.

2. Description of the Related Art

FIG. 26 is a block diagram showing a main part of a conventional image sensor such as disclosed in Japanese Patent Application Laid-Open No. 8-204899. As illustrated in FIG. 26, a glass plate 2 is fixed to a frame 1 for positioning each of the components, and is also located at the feeding plane of the sheet to be read or original copy 3. An LED substrate 4 is positioned at an angle to the glass plate 2 and fixed to the frame 1. On the LED substrate 4 are arranged linearly a plurality of photo diodes 5 serving as point light emitting elements and these photo diodes 5 constitute a line light source.

On a sensor substrate 6 that is positioned and fixed to the frame 1, a plurality of sensor ICs (integrated circuits) 7 are arranged linearly so as to correspond with the read width of the image sensor. Each of the sensor ICs 7 are several millimeters in length. A rod lens array 8 for forming an orthographic full size image (or a full-scale erect image) is provided between the glass plate 2 and the sensor IC 7. The glass plate 2, the LED substrate 4, the sensor substrate 6, and the rod lens array 8 are fixed to the frame 1 by an adhesive.

Next, the operations will now be explained. A light emitted from the photo diodes 5 is illuminated through the glass plate 2 to the original copy 3. The light illuminated on the original copy 3 is reflected back in accordance with the degree of image contrast on the original copy 3. The reflected light is then transmitted through a rod lenses of the rod lens array 8 to form an image on the sensor IC 7. In the sensor IC 7, electric charges are accumulated depending upon the intensity of the reflected light to output information on the intensity of the reflected light through the sensor substrate 6. Accordingly, the image information of the entire original copy 3 is output by feeding the original copy 3 onto the glass plate 2.

Such a conventional image sensor was mainly employed for image input devices such as facsimiles in which the original copy moves to allow the image to be read in. With the recent popularity of personal computers along with advances in the personalization of various computer peripherals, downsizing image input units is sought.

On the other hand, when conventional image sensors are reduced in size in an attempt to utilize them in a handy scanner, the following problems occur. That is, in the conventional image sensor, the glass plate 2 directly contacts the original copy 3, so the glass plate 2 can be easily damaged by undue force applied by the user, being dropped from a desk, etc. Further, the rod lens array 8 is also reduced in size (e.g., 1 mm (width)×2–4 mm (height)). Accordingly, when the operating environment temperature varies after the rod lens array 8 is adhered to the frame 1, the rod lens array 8 will be warped because the rod lens array 8 and the frame 1 have different thermal expansion coefficients. As a result, there is a fear that the reflected light emitted from the original copy 3 will not form a image on the sensor IC 7. There is also the fear that proper image formation cannot be obtained because when the glass plate 2 is adhered to the rod lens array 8, they are both dimensioned so small that adhesive flows out onto the surface of the lens at both ends of the rod lens array 8.

SUMMARY OF THE INVENTION

The present invention is made to overcome such problems as set forth above, and has an object to provide an image sensor that can prevent breakage from occurring at the portion where light is input/output, and which can stably form an image of reflected light from a copy to be read on a light receiving element.

To this end, according to one aspect of the present invention, there is provided an image sensor comprising: a frame including a plurality of engaging portions and a lens positioning surface; a line light source provided within the frame for emitting a light to illuminate an original copy; a substrate fixed to the frame; a light receiving element formed on the substrate for receiving light reflected from the original copy; a transparent plate fixed to the frame by being engaged with the engaging portions for passing light emitted from the line light source and the light reflected from the original copy; an optical image forming component fixed to the frame by being pressed against the lens positioning surface by the transparent plate for forming an image of the reflected light from the original copy onto the light receiving element; and an original copy positioning member for defining the position of the original copy by contacting the original copy in such a manner that the transparent plate is spaced apart from and faces the original copy.

BRIEF DESCRIPTION OF THE DRAWINGS

Objects and advantages of the present invention will be apparent from the following description taken with the accompanying drawings, wherein.

DETAILED DESCRIPTION OF THE PREFERRED EMBODIMENTS

The preferred embodiments of the present invention will be described below with reference to the accompanying drawings.

First Embodiment

Figure 1:
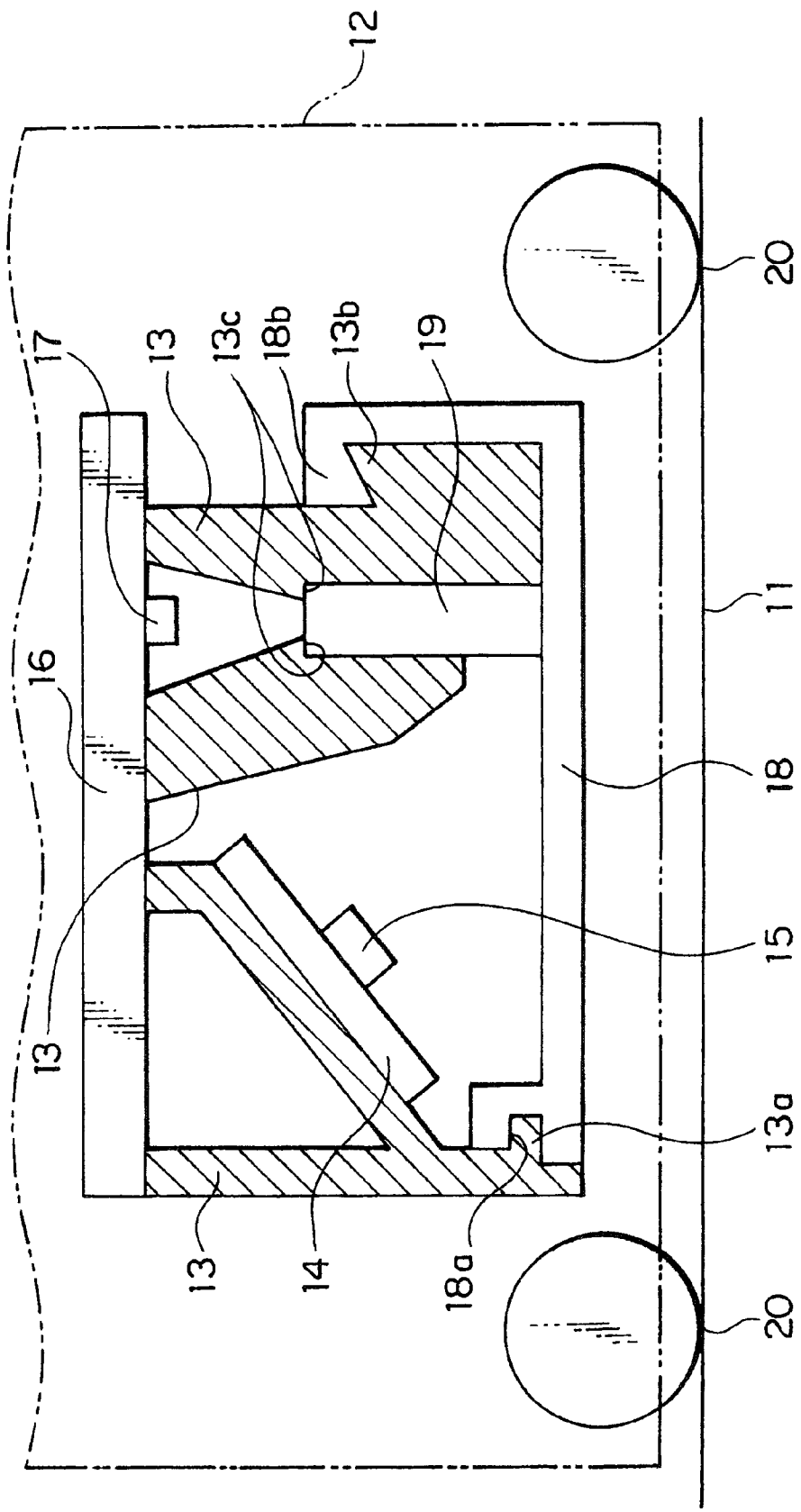
FIG. 1 is a block diagram showing an image sensor according to a first embodiment of the present invention.

FIG. 1 is a block diagram showing an image sensor according to a first embodiment of the present invention. A copy to be read 11 (hereinafter referred to as original copy) is located on a base such as a desk (not shown) as illustrated in FIG. 1. A frame 13 is fitted to a portable or handy scanner housing 12 that moves on the original copy 11, and includes first and second engaging portions 13a and 13b and lens positioning surfaces 13c.

An LED (light emitting diode) substrate 14 and a sensor substrate 16 are also fixed to the frame 13. On the LED substrate 14, there are arranged linearly a plurality of photo diodes 15 serving as the point light emitting elements that illuminate the original copy 11, these photo diodes constituting a line light source. On the sensor substrate 16 are arranged linearly a plurality of sensor ICs 17 serving as the light receiving elements for receiving the light reflected from the original copy 11. These sensor ICs 17 include a plurality of light receiving portions, respectively.

A transparent plate 18 facing the original copy 11 is attached to the frame 13. The transparent plate 18 is composed of a resin molding material such as acrylic or polycarbonate. Further, a recess 18a and a claw portion 18b are formed in the transparent plate 18. The transparent plate 18 is attached to the frame 13 without any adhesive by engaging the recess 18a with the first engaging portion 13a and by hooking the claw portion 18b over the second engaging portion 13b.

Between the transparent plate 18 and the sensor IC 17, there is provided a rod lens array (an optical component for image forming) 19 for forming an orthographic full size image (or a full-scale erect image), by which light reflected from the original copy 11 to form an image onto the sensor IC 17. The rod leans array 19 is constantly pressed against the lens positioning surfaces 13c by the transparent plate 18 and positioned and mounted in the frame 13 by the pressure. The handy scanner housing 12 is provided with a plurality of freely rotatable rollers 20 serving as original copy positioning members that contact the original copy 11 to position it. These rollers 20 are arranged in such a manner that the transparent plate 18 faces the original copy 11 but spaced apart therefrom.

Next, the operations will now be explained. Light emitted from the photo diodes 15 passes through the transparent plate 18 to the original copy 11. The light illuminated on the original copy 11 is reflected back in accordance with the image contrast of the original copy 11. The reflected light is transmitted through the rod lenses of the rod lens array 19 to form an image on the sensor IC 17. In the sensor IC 17, electric charges are accumulated depending upon the intensity of the reflected light to output information on the intensity of the reflected light through the sensor substrate 16. Accordingly, the handy scanner 12 is moved along the original copy 11, then the image information of the entire original copy 11 can be output.

In such an arrangement of the image sensor, the rollers 20 define the position of the original copy 11, and the transparent plate 18 faces the original copy 11 with an interval therebetween. As a result, the transparent plate 18 is prevented from directly pressing against a desk or the like, or from suffering any direct shock due to a drop thereof or the like. Therefore, any damage can be avoided to the transparent plate 18. Further, although the transparent plate 18 may be made of glass, in the first embodiment of the present invention, the transparent plate 18 is made of a resin molding material, so damage to the transparent plate 18 can be reliably prevented.

Since the rod lens array 19 is mounted to the frame 13 without any adhesive, relative movements between the rod lens array 19 and the frame 13 may absorb differences in the thermal expansion coefficients of the frame 13 from and the rod lens array 19. As a result, it is possible to stably form the reflected light from the original copy to form a stable image onto the sensor IC 17. In addition, since no adhesive is used between the rod lens array 19 and the transparent plate 18, a proper image formation by the rod lens array 19 is not prevented by any stray adhesive, thereby allowing stable image-formation of the reflected light on the sensor IC 17.

It should be noted that although in the first embodiment of the present invention, the rod lens array 19 is fixed to the frame 13 without any adhesive, an adhesive may be used at only one point. That is, if one point adhesion is employed, the rod lens array 19 and the frame 13 may expand relatively about that point, thus allowing the differences in the thermal expansion coefficients therebetween to be absorbed.

Second Embodiment

Figure 2:
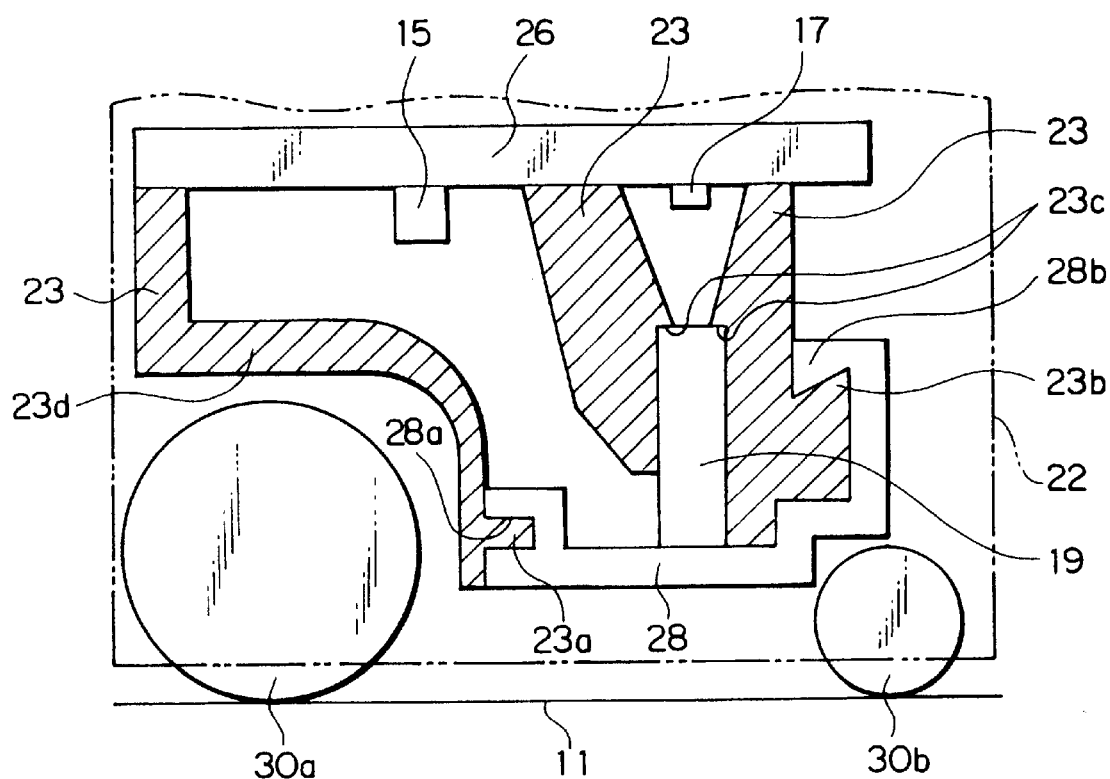
FIG. 2 is a block diagram showing an image sensor according to a second embodiment of the present invention.

FIG. 2 is a block diagram showing an image sensor according to a second embodiment of the present invention. A frame 23 is attached to a handy scanner housing 22 that moves on the original copy 11, as illustrated in FIG. 2. On the frame 23 is formed a first and second engaging portions 23a and 23b and lens positioning surfaces 23c.

The frame 23 is fixed to a substrate 26 incorporating a plurality of photo diodes 15 and a plurality of sensor ICs 17. A transparent plate 28 is attached to the frame 23 without any adhesive by inserting the first engaging portion 23a into a recess 28a and hooking a claw portion 28b over the second engaging portion 23b.

A plurality of rollers 30a and 30b are rotatably provided in the handy scanner housing 22, serving as original copy positioning members. The roller 30a having a larger diameter than that of the roller 30b is arranged opposite to the substrate 26, and the frame 23 is provided with a recess 23d accommodating a part of the roller 30a. Other arrangements are the same as in the first embodiment of the present invention.

In such an arrangement of the image sensor, the rollers 30a and 30b define the position of the original copy 11. The transparent plate 28 faces the original copy 11 so as to be spaced therefrom, so that damages to the transparent plate 28 can be avoided in the same fashion as in the first embodiment of the present invention. Further, since no adhesive is used for the rod lens array 19, the frame 23, and the transparent plate 28, the reflected light from the original copy 11 can be formed on the sensor IC 17 as an image with stability.

In addition, the photo diodes 15 and the sensor ICs 17 are mounted on the same substrate 26, no component is arranged between thus rod lens array 19 and the roller 30a, and a recess 23d accommodating a part of the roller 30a is formed in the frame 23. As a result, a distance between the rollers 30a and 30b can be made smaller to downsize the device as a whole and to reliably prevent foreign matter from contacting the transparent plate 28.

Third Embodiment

Figure 3:
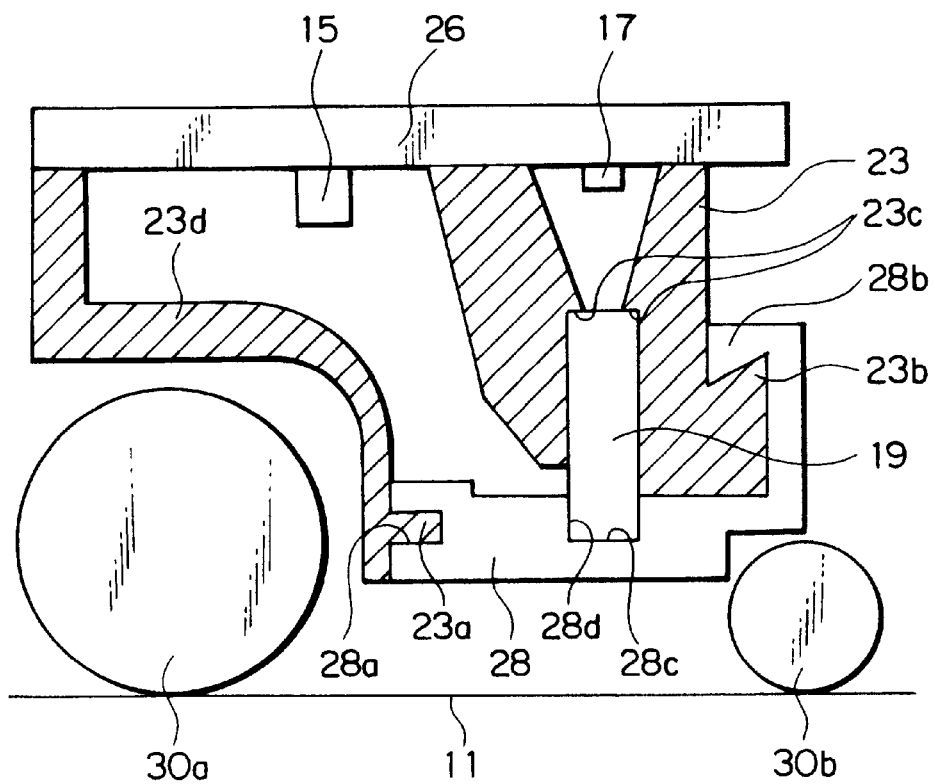
FIG. 3 is a block diagram showing an image sensor according to a third embodiment of the present invention.

FIG. 3 is a block diagram showing an image sensor according to a third embodiment of the present invention. A recess 28c into which the end of the rod lens array 19 is inserted is formed in a transparent plate 28, as illustrated in FIG. 3. The recess 28c is provided with an abutting surface 28d for abutting against the end side surface of the rod lens array 19. Other arrangements are the same as in the second embodiment of the present invention.

In such an arrangement of the image sensor, the abutting surface 28d abuts against the side surface of the rod lens array 19. As a result, the rod lens array 19 or the transparent plate 28 can be prevented from moving with respect to the frame 23 due to a collision such as a drop, thereby providing for more tight construction as a whole.

Fourth Embodiment

Figure 4:
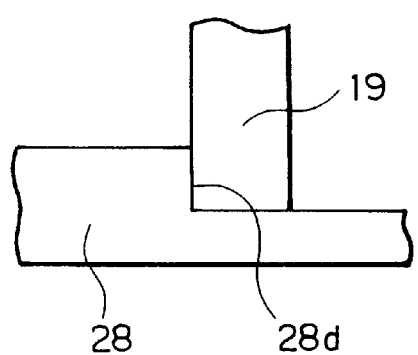
FIG. 4 s a block diagram showing a main part of an image sensor according to a fourth embodiment of the present invention.

In the third embodiment of the present invention, the recess 28c is formed in the transparent plate 28. However, a simple step portion may be formed instead as illustrated in FIG. 4.

Fifth Embodiment

Figure 5:
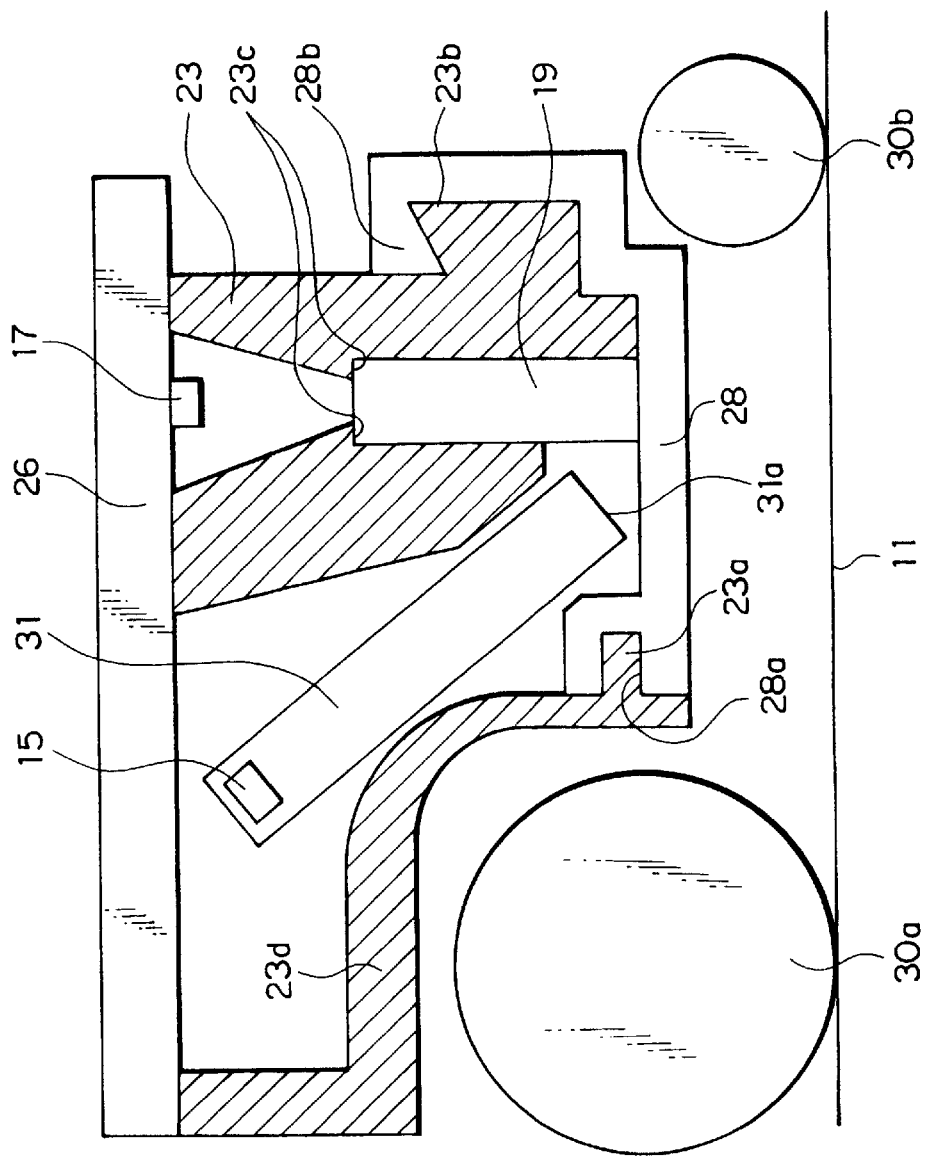
FIG. 5 is a block diagram showing an image sensor according to a fifth embodiment of the present invention.

FIG. 5 is a block diagram showing an image sensor according to a fifth embodiment of the present invention. In this embodiment, between a substrate 26 and a transparent plate 28 is provided a light guide member 31 composed of a transparent glass, a transparent resin or the like. A photo diode 15 is mounted to directly introduce light from any surface of the light guide member 31. The light introduced into the light guide member 31 is output from an output face 31a facing the transparent plate 28. A line light source according to this embodiment includes the photo diode 15 and the light guide member 31.

In the image sensor described above, light from the photo diode 15 is arranged to illuminate the original copy 11 through the light guide member 31, and thus a balanced line light source can be achieved with less photo diodes 15. Also, as the freedom of placing the photo diode 15 is improved, a reduction in size as a whole becomes possible.

Further, in the fifth embodiment, although the photo diode 15 is attached to a side surface of the light guide member 31, however, the photo diode 15 may also be mounted on the substrate 26.

Sixth Embodiment

Figure 6:
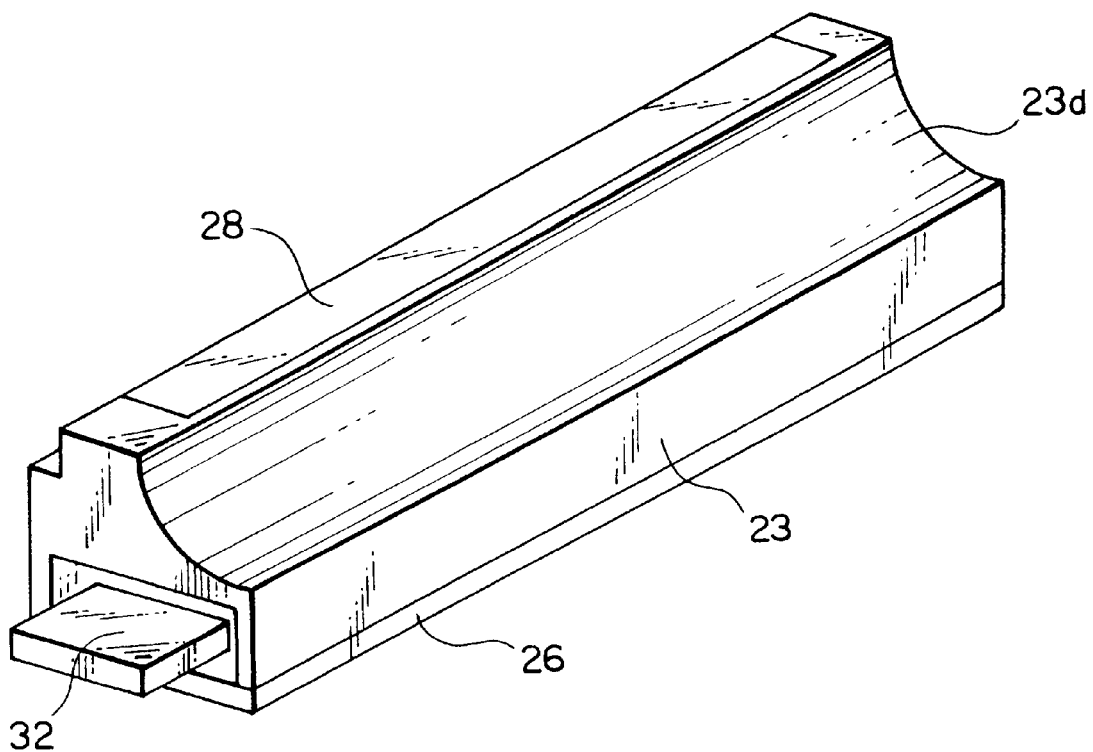
FIG. 6 is a perspective view showing a main part of an image sensor according to a sixth embodiment of the present invention.

FIG. 6 is a perspective view showing a main part of an image sensor according to a sixth embodiment of the present invention. In this case, a connector 32 for electrically connecting a substrate 26 to an external apparatus protrudes from the end in a longitudinal direction of a frame 23. Other arrangements are the same as in the second embodiment of the present invention.

In such an arrangement of the image sensor, the connector 32 is formed at the end in the longitudinal direction of the frame 23, and therefore the connector 32 can be formed without enlarging the cross section of the frame 23, thereby allowing downsizing as a whole.

Seventh Embodiment

Figure 7:
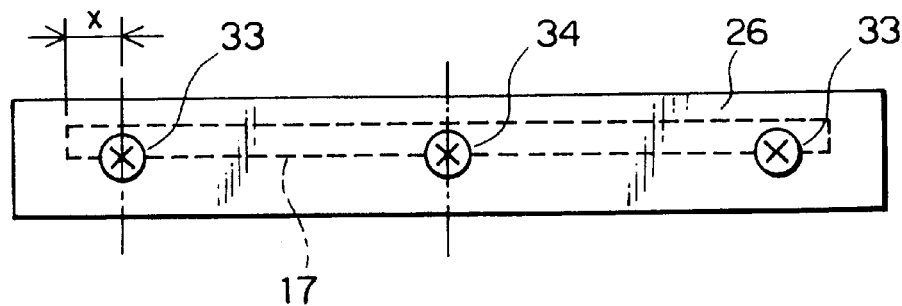
FIG. 7 is a plan view showing a substrate of an image sensor according to a seventh embodiment of the present invention.

FIG. 7 is a plan view showing a substrate of an image sensor according to a seventh embodiment of the present invention. As shown in FIG. 7, a substrate 26 incorporating sensor ICs 17 that are arranged linearly is fixed to a frame 23 (FIG. 2) by screws 33 positioned at both ends in the longitudinal direction of the substrate 26 and a screw 34 positioned between these screws 33. The screws 33 are located at a position X extending from the ends of the row of the sensor ICs 17 to the center in the longitudinal direction of the substrate 26. The number of the screws 34 is determined on the basis of the length of the substrate 26. Other arrangements are the same as in the second embodiment of the present invention.

Figure 8:
FIG. 8 is a front view showing a state where there is warpage on the substrate to which a sensor IC is adhered.

In this embodiment, since the sensor ICs 17 are adhered to the substrate 26 by an adhesive, warps occur on the substrate 26 such as illustrated in FIG. 8 because of the differences in thermal expansion coefficients between the substrate 26 and the sensor IC 17. FIG. 8 shows a warp of z produced on the substrate 26 with a thickness of t. In FIG. 8, as a material of the substrate 26, example includes a resin such as a glass fiber epoxy resin, while the main material of the sensor IC 17 is of a metal such as silicone wafer.

As described above, if the sensor IC is adhered to the substrate 26 by an adhesive, and the adhesive is then thermally hardened the adhesive, a thermal expansion occurs in both the substrate 26 and the sensor IC 17. However, the adhesive is hardened in a state where the substrate 26 made of resin is expands more than the sensor IC 17 made of metal. Then, when returned to the normal temperature, since the substrate 26 shrinks more than the sensor IC 17, the warp as shown in FIG. 8 occurs. So, when warpage occurs in the substrate 26, the distance between the rod lens array 19 and the sensor IC 17 varies depending upon the position of the sensor IC 17.

Figure 9:
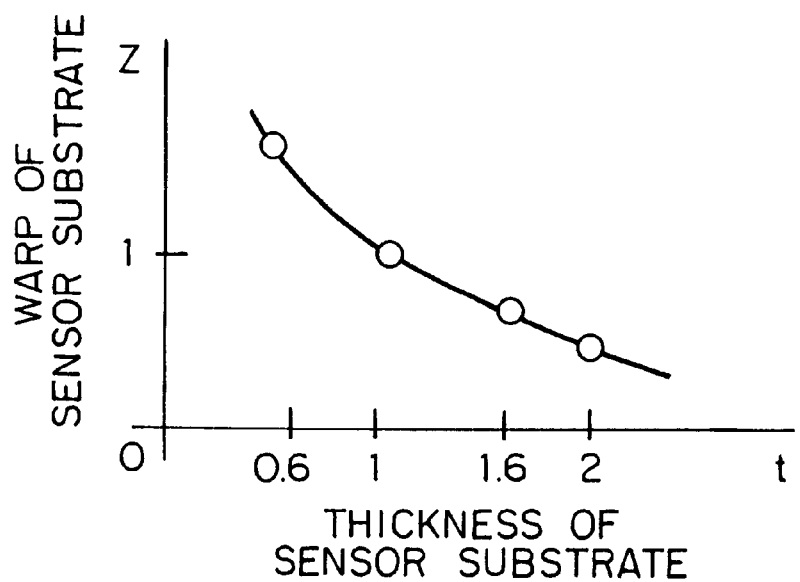
FIG. 9 is a relational diagram showing the relationship between the measured thickness and degree of warp of the sensor substrate.

FIG. 9 is a relational diagram showing a measurement result about the relationship between the thickness t and the degree of warp z of the sensor substrate. As indicated in FIG. 9, the thinner the sensor substrate 26, the larger the warp amount z. The inventors made various experiments employing sensor substrates 26 having thicknesses of 0.3 mm, 1.0 mm, 1.6 mm, and 2.0 mm, and found the optimal value x in case of FIG. 7. A relationship x=20 mm and t=0.6 mm was established.

In the case where the substrate 26 is fixed to the frame 23 by the screws 33 and 34 while satisfying the above conditions, and the warp of the substrate 26 is forcibly restricted, fluctuation of the distance from the sensor IC 17 to the rod lens array 19 which depends on the position of the sensor IC 17 may be avoided to thereby improve the degree of precision for positioning the sensor IC 17 relative to the rod lens array 19. Therefore, the resolution of the image sensor can be prevented from deteriorating.

Eighth Embodiment

Figure 10:
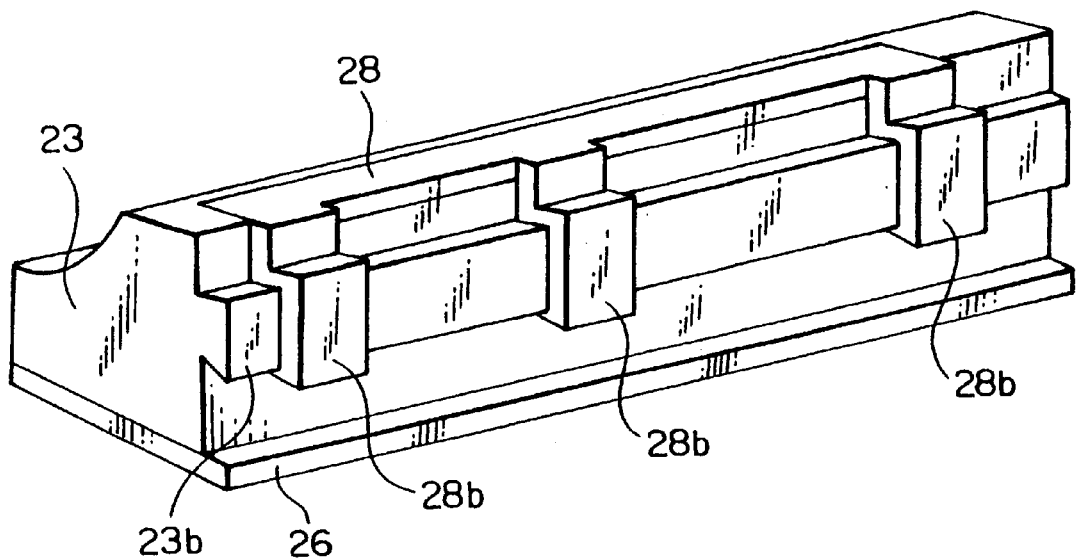
FIG. 10 is a perspective view showing a main part of an image sensor according to an eighth embodiment of the present invention.

FIG. 10 is a perspective view showing a main part of an image sensor according to an eighth embodiment of the present invention. A plurality of claw portions 28b, as illustrated in FIG. 10, are hooked to second engaging portions 23b of a frame 23 and mounted to a transparent plate 28 so as to be spaced apart in a longitudinal direction. Other arrangements are the same as in the second embodiment of the present invention.

In such an arrangement of the image sensor, the plurality of claw portions 28b are formed so as to be spaced apart from each other, and individual claw portions 28b can be made smaller, thereby facilitating assembly of the transparent plate 28 to the frame 23.

The number of claw portions 28b may be 2 or 4 or more.

There may be also a plurality of first engaging portions 23a and recesses 28a as previously shown in FIG. 2 spaced apart from each other in a longitudinal direction of the frame 23.

Ninth Embodiment

Figure 11:
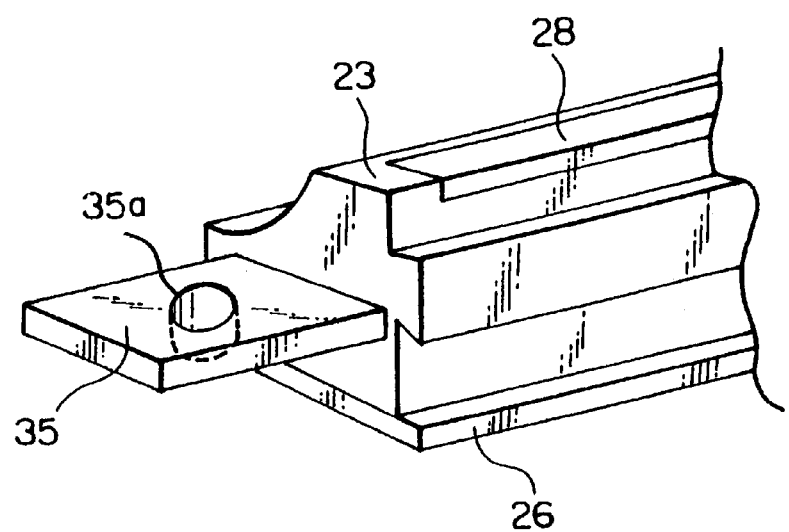
FIG. 11 is a perspective view showing a main part of an image sensor according to a ninth embodiment of the present invention.

FIG. 11 is a perspective view showing a main part of an image sensor according to a ninth embodiment of the present invention. A positioning portion 35 for positioning a frame 23 with respect to a handy scanner housing 22, as illustrated in FIG. 11, is formed so as to project from the end in a longitudinal direction of the frame 23. The positioning portion 35 is also provided with a hole 35a. Other arrangements are the same as in the second embodiment of the present invention.

In such an arrangement of the image sensor, the frame 23 is attached to the handy scanner housing 22 by inserting a screw or pin through the hole 35a. The positioning portion 35 is formed at the end in the longitudinal direction of the frame 23, and therefore the frame 23 is precisely attached to the handy scanner housing 22 without enlarging a cross section of the frame 23, enabling size reduction as a whole.

Tenth Embodiment

Figure 12:
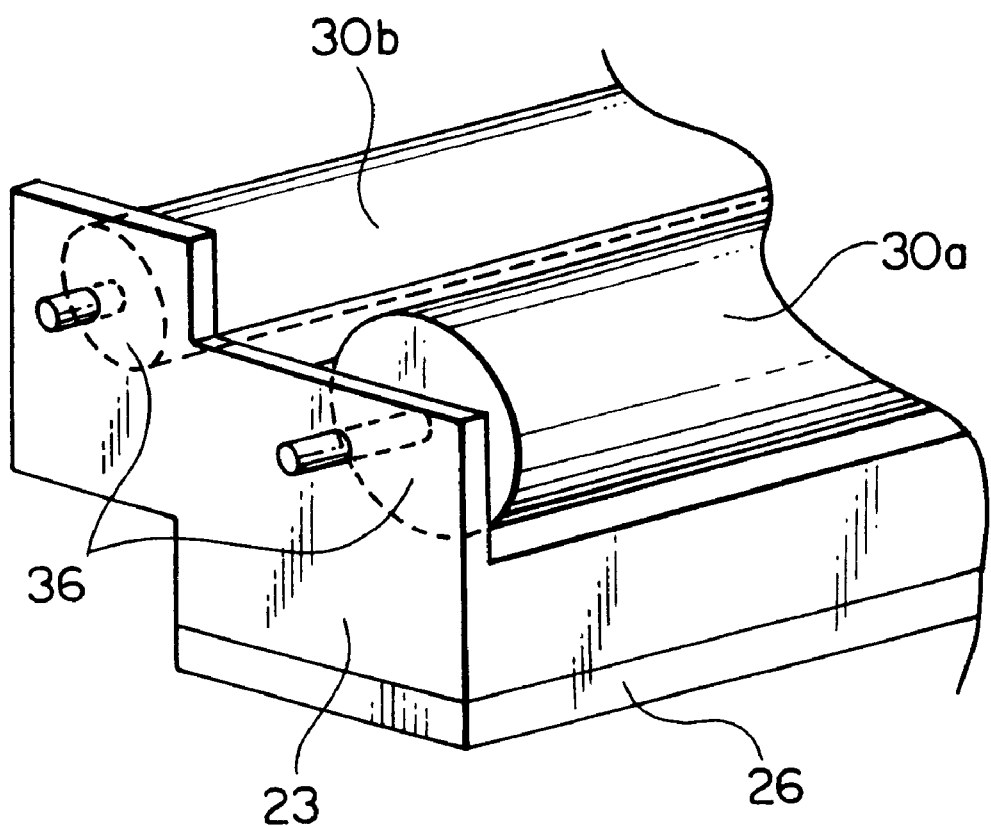
FIG. 12 is a perspective view showing an image sensor according to a tenth embodiment of the present invention.

FIG. 12 is a perspective view showing an image sensor according to a tenth embodiment of the present invention. Roller supporting portions 36 for positioning and rotatably supporting an axis end of the rollers 30a and 30b are integrally formed in a frame 23, as illustrated in FIG. 12. Other arrangements are the same as in the second embodiment of the present invention.

In such an arrangement of the image sensor, the roller supporting portions 36 are formed in the frame 23. As a result, the rollers 30a and 30b can be precisely attached to the frame 23, and the frame 23 can be precisely arranged relative to a reading position for the original copy 11, thereby being capable of improving the precision of image reading.

Eleventh Embodiment

Figure 13:
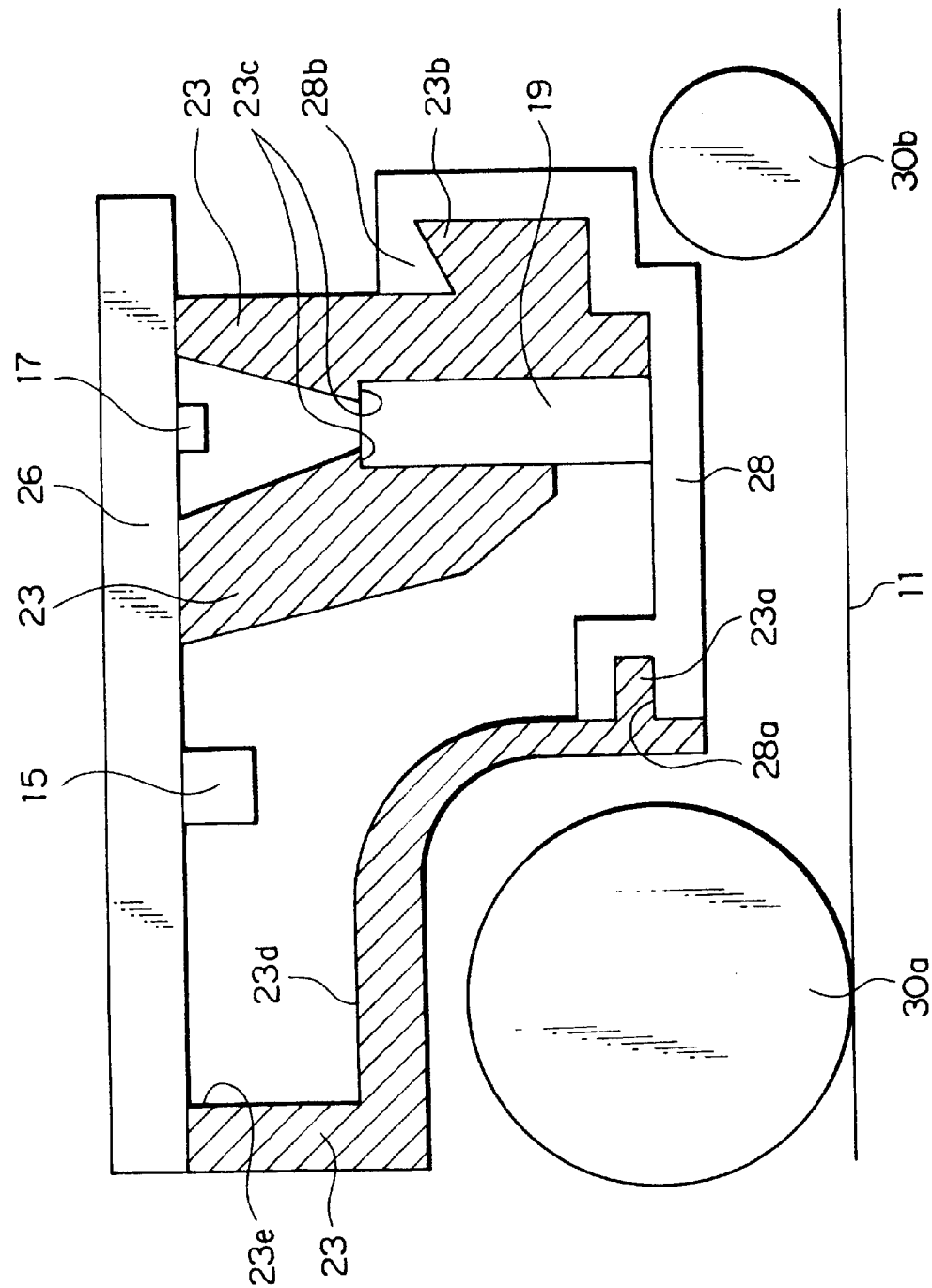
FIG. 13 is a block diagram showing an image sensor according to an eleventh embodiment of the present invention.

FIG. 13 is a block diagram showing an image sensor according to an eleventh embodiment of the present invention. The end surface of a substrate 26 abuts against a substrate positioning surface 23e of a frame 23, so that the substrate 26 may be positioned with respect to the frame 23, as illustrated in FIG. 13. Other arrangements are the same as in the second embodiment of the present invention.

In such an arrangement of the image, the substrate 26 is positioned to the frame 23 by abutting the end surface of the substrate 26 against the substrate positioning surface 23e of the frame 23. Therefore, precision in positioning a sensor IC 17 with respect to a rod lens array 19 can be improved, thereby allowing the precision of reading an image to be improved.

Twelfth Embodiment

Figure 14:
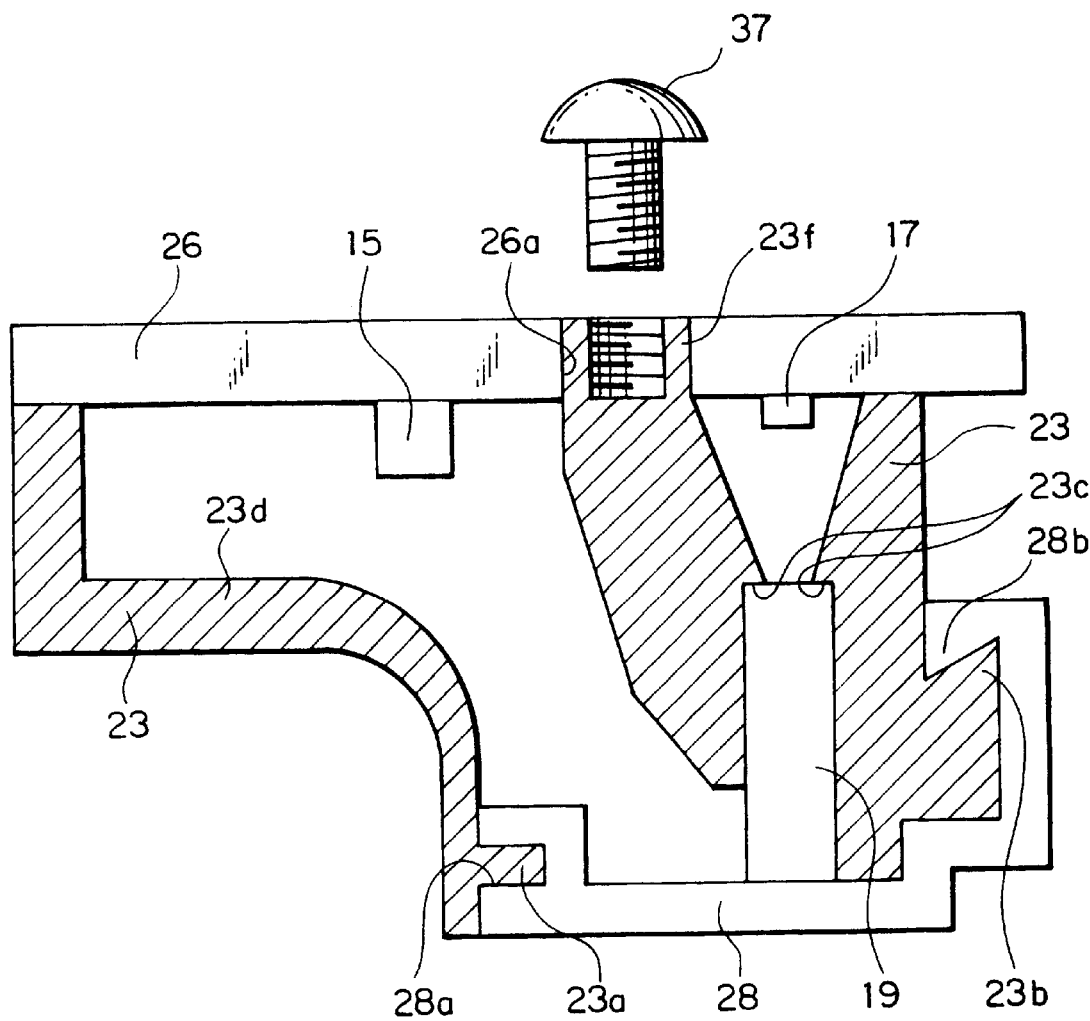
FIG. 14 is a block diagram showing a main part of an image sensor according to a twelfth embodiment of the present invention.
Figure 15:
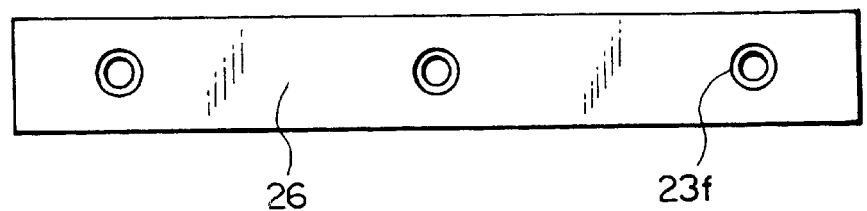
FIG. 15 is a plan view showing a substrate of FIG. 14 before strews are screwed to the substrate.

FIG. 14 is a block diagram showing a main part of an image sensor according to a twelfth embodiment of the present invention. A positioning hole 26a is formed in a substrate 26, and an inserting portion 23f is formed in a frame 23 as illustrated in FIG. 14. The inserting portion 23f is inserted into the positioning hole 26a, so that the substrate 26 is positioned with respect to the frame 23. Further, a screw 37 is screw fitted to the inserting portion 23f to prevent the inserting portion 23f from dropping out from the substrate 26. FIG. 15 if a plan view showing a substrate 26 of FIG. 14 before the screw 37 is screw fitted thereto. Other arrangements are the same as in the second embodiment of the present invention.

In such an arrangement of the image sensor, the substrate 26 is positioned with respect to the frame 23 by inserting the inserting portion 23f of the frame 23 into the positioning hole 26a of the substrate 26. Therefore, precision in positioning a sensor IC 17 with respect to a rod lens array 19 can be improved, thereby allowing the precision of reading an image to be improved.

Incidentally, the screw 37 is screw fitted to the inserting portion 23f in the twelfth embodiment of the present invention, the inserting portion 23f may carry out the only positioning and the screw 37 may be screw fitted to other portions. Further, the substrate 26 may be fixed to the frame 23 in another way without the screw 37.

Thirteenth Embodiment

Figure 16:
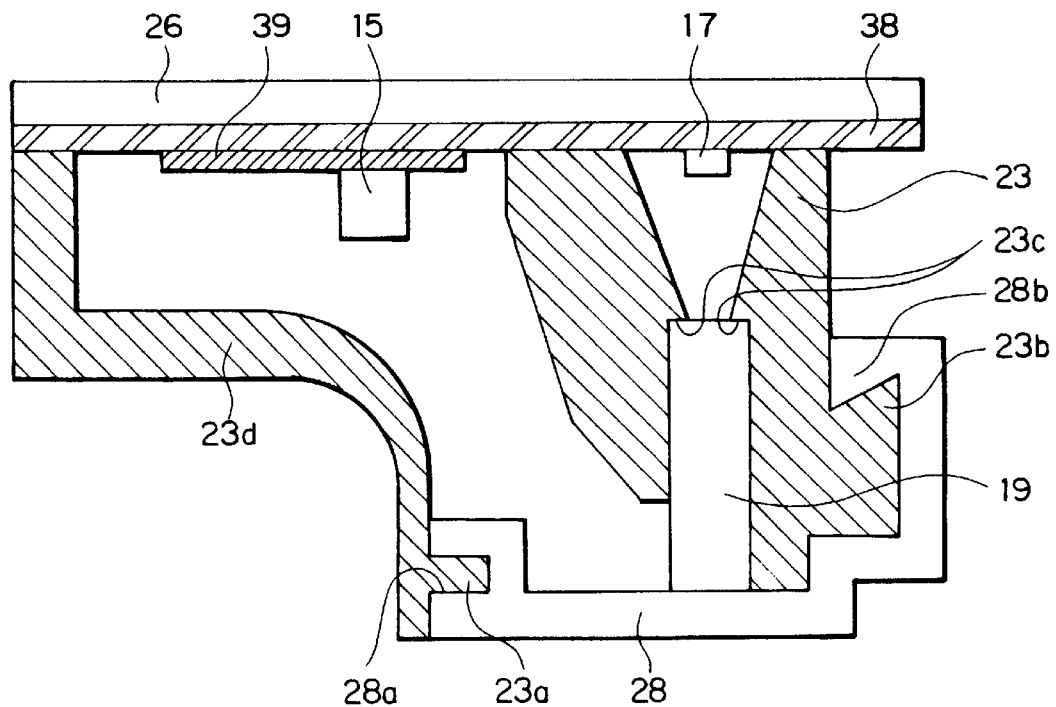
FIG. 16 s a block diagram showing a main part of an image sensor according to a thirteenth embodiment of the present invention.

FIG. 16 is a block diagram showing a main part of an image sensor according to a thirteenth embodiment of the present invention. In this embodiment, a conductor pattern 38 such as a copper pattern is formed on a substrate 26, and a resist layer 39 for protecting the conductor pattern 38 is formed on the conductor pattern 38. Since the resist layer 39 does not cover the entire surface of the conductor pattern 38, a portion of the conductor pattern 38 is exposed to the surface. By abutting a frame 23 against the exposed conductor pattern 38, the substrate 26 is positioned with respect to the frame 23. A photo diode 15 is provided onto the resist layer 39.

In such an arrangement of the image sensor, the conductor pattern 38 with higher stability in thickness in comparison with the resist layer 39 is exposed to the surface. The exposed conductor pattern 38 abuts against the frame 23, thereby positioning the substrate 26 with respect to the frame 23. Therefore, precision in positioning a sensor IC 17 with respect to a rod lens array 19 can be improved, thereby allowing the precision of reading an image to be improved.

Fourteenth Embodiment

Figure 17:
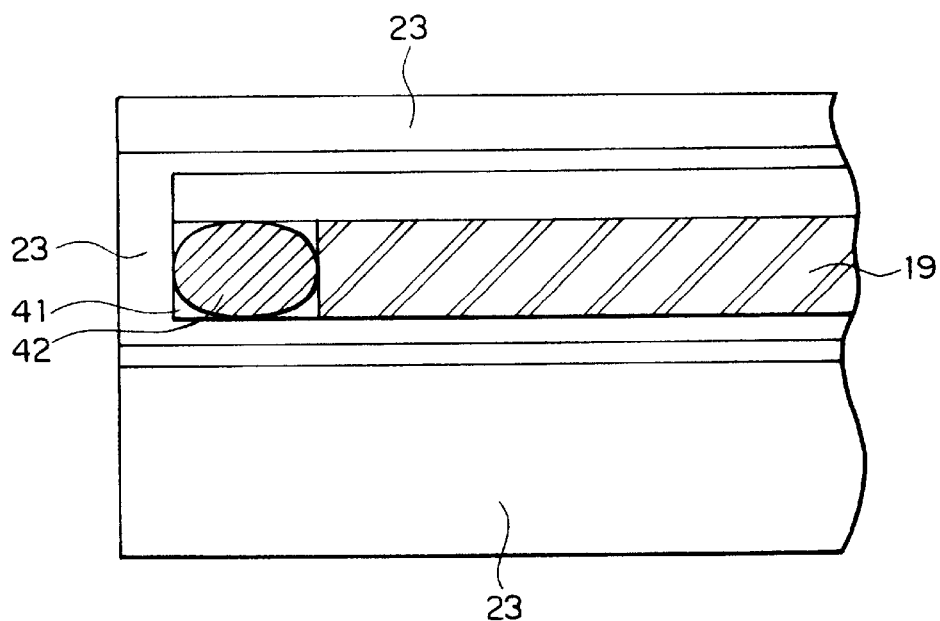
FIG. 17 is a block diagram showing a main part of an image sensor according to a fourteenth embodiment of the present invention.

FIG. 17 is a block diagram showing a main part of an image sensor according to a fourteenth embodiment of the present invention. FIG. 17 is also a diagram showing a frame 23 viewed from the bottom of FIG. 2 with the transparent plate 28 removed. In the figure, a gap 41 formed between the end in a longitudinal direction of the rod lens array 19 and frame 23 is filled with a resilient adhesive (sealing agent may substitute) 42 which is then hardened. Other arrangements are the same as in the second embodiment of the present invention.

In this embodiment, the vertical movement of the rod lens array 19 is restricted by the frame 23 as shown in FIG. 17, while the vertical movement shown in FIG. 2 is restricted by the lens positioning surfaces 23*c* and the transparent plate 28. Accordingly, the rod lens array 19 does not move under normal use. When the image sensor is employed as a handy scanner, however, it is desirable for the image sensor to maintain its performance even in the case of an unusual impact such as from falling from a desk onto a concrete floor.

According to the fourteenth embodiment of the present invention, even the inevitable gap 41 generated due to tolerances between the length of the frame 23 and the rod lens array 13 is filled with an adhesive 42. As a result, movement of the rod lens array 19 can be suppressed against unusual impacts. Further, since the adhesive 42 is composed of a material that is sufficiently resilient in comparison to the rod lens array 19 and the frame 23, it is capable of absorbing the differences in thermal expansion coefficients arising from changes in temperature.

Fifteenth Embodiment

Figure 18:
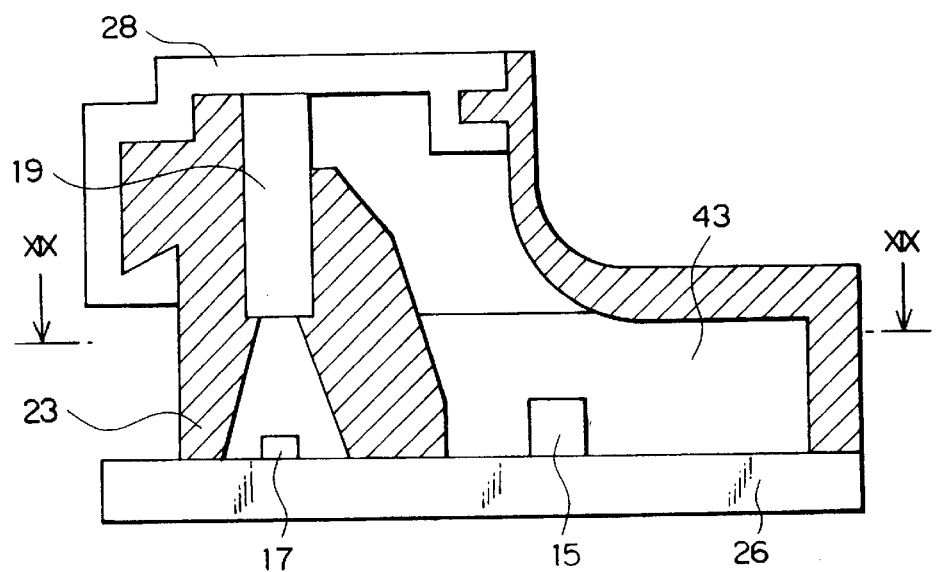
FIG. 18 is a block diagram showing a main part of an image sensor according to a fifteenth embodiment of the present invention.
Figure 19:
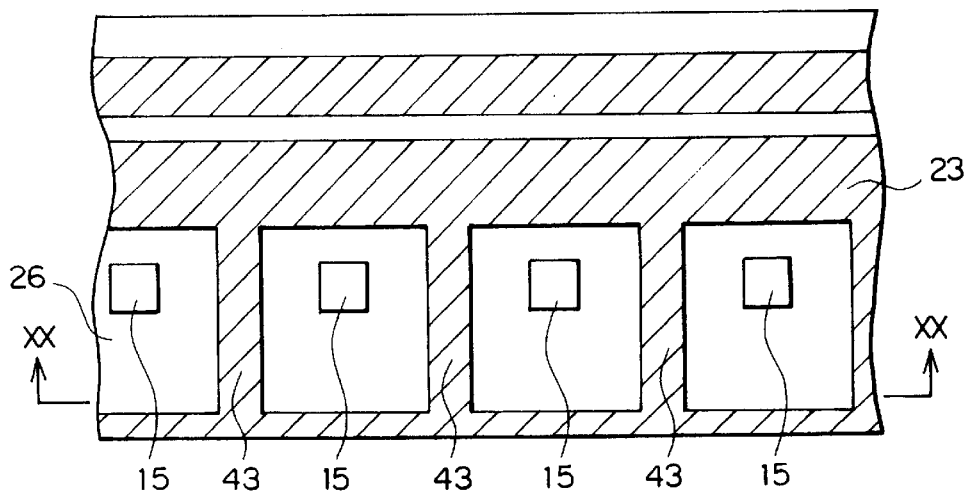
FIG. 19 is a cross-sectional view taken along the line XIX—XIX of FIG. 18.
Figure 20:
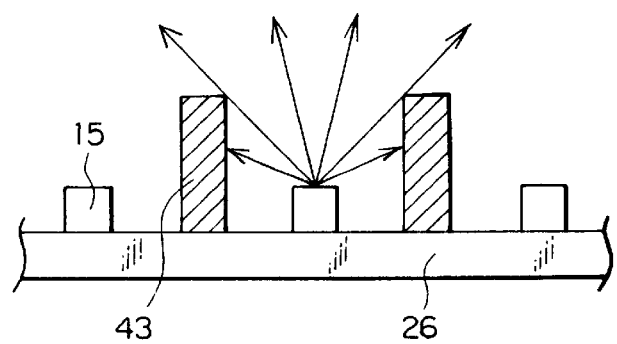
FIG. 20 is a cross-sectional view taken along the line XX—XX of FIG. 19.

FIG. 18 is a block diagram showing a main part of an image sensor according to a fifteenth embodiment of the present invention; FIG. 19 is a cross-sectional view taken along the line XIX—XIX of FIG. 18; and FIG. 20 is a cross-sectional view taken along the line XX—XX of FIG. 19. In the embodiment, ribs 43 for partitioning photo diodes 15 adjacent to each other are formed in the frame 23. Other arrangements are the same as in the second embodiment of the present invention.

In such an arrangement of the image sensor, since the ribs 43 are formed in the frame 23, mechanical strength of the frame 23 may be improved. Further, these ribs 43 are arranged between adjacent photo diodes 15, so that light that would not normally reach the transparent plate 28 can be distributed in a well-balanced manner, thereby enabling the original copy 11 to be uniformly illuminated.

According to the fifteenth embodiment of the present invention, the ribs 43 are formed so that the photo diodes 15 are partitioned one by one, however, the ribs 43 may also be formed so as to partition a plurality of photo diodes 15.

Also, more light may be illuminated on the original copy 11 by coloring the surfaces of the ribs 43 with a color having high reflectivity such as white or metal gloss, so that the efficiency of reading an image can be improved. In this embodiment, in order to reflect the light effectively, the reflectivity may preferably be 100%. However, sufficient effects from a reflectivity of 50% or more (reflectivity of 0–100% as black; a threshold value when divided simply into two, i.e., black and white; reflectively of 50% or more as white).

Sixteenth. Embodiment

Figure 21:
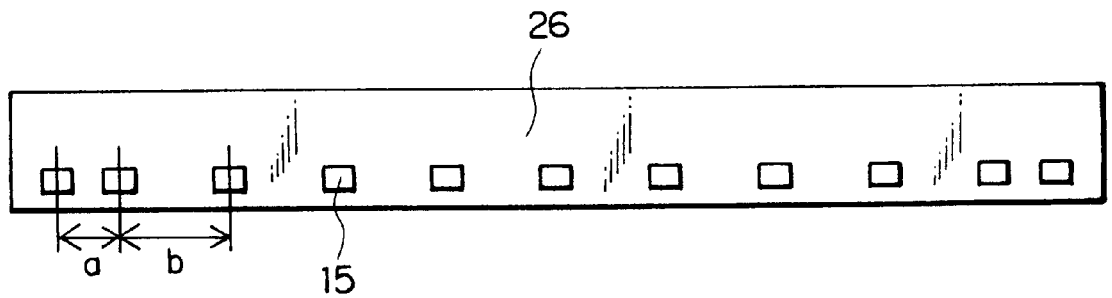
FIG. 21 is a plan view showing a line light source of an image sensor according to a sixteenth embodiment of the present invention.

FIG. 21 is a plan view showing a line light source of an image sensor according to a sixteenth embodiment of the present invention. In this embodiment, a plurality of photo diodes 15 are arranged linearly on a substrate 26, constituting a line light source. However, at least two photo diodes 15 located at both ends in a longitudinal direction of the line light source have a slightly smaller installation interval "a" than an installation interval "b" of the other photo diodes 15. Other arrangements are the same as in the second embodiment of the present invention.

Figure 22:
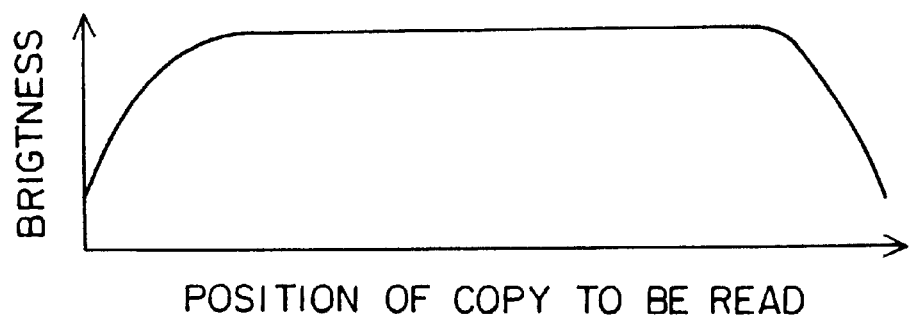
FIG. 22 is a relational diagram showing a relationship between the position of the copy to be read and the brightness in the case where all the photo diodes are mounted at equal intervals.
Figure 23:
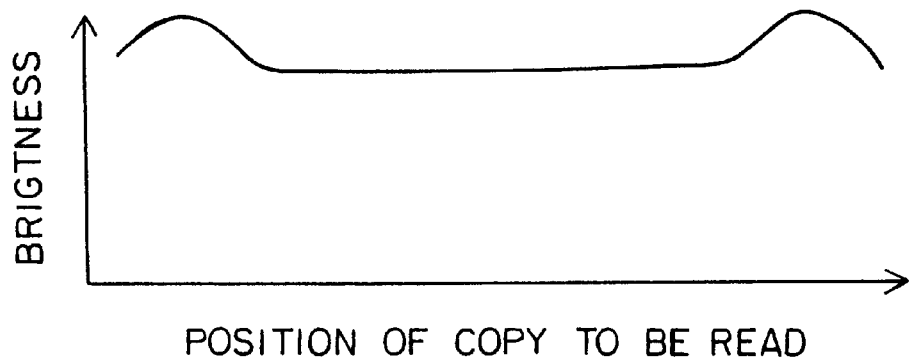
FIG. 23 is a relational diagram showing a relationship between the position of the copy to be read and the brightness in the case where the line light source of FIG. 21 is employed.

In this embodiment, if all the installation intervals of the photo diodes 15 are made identical, illumination of the original copy 11 may deteriorate at both ends in a longitudinal direction of the line light source, as shown in FIG. 22, for example. However, for example, by reducing the installation interval "a" at the both ends of the line light source in the sixteenth embodiment of the present invention, the illumination can be kept from deteriorating at both ends in the longitudinal direction of the line light source, as indicated in FIG. 23.

Seventeenth Embodiment

Figure 24:
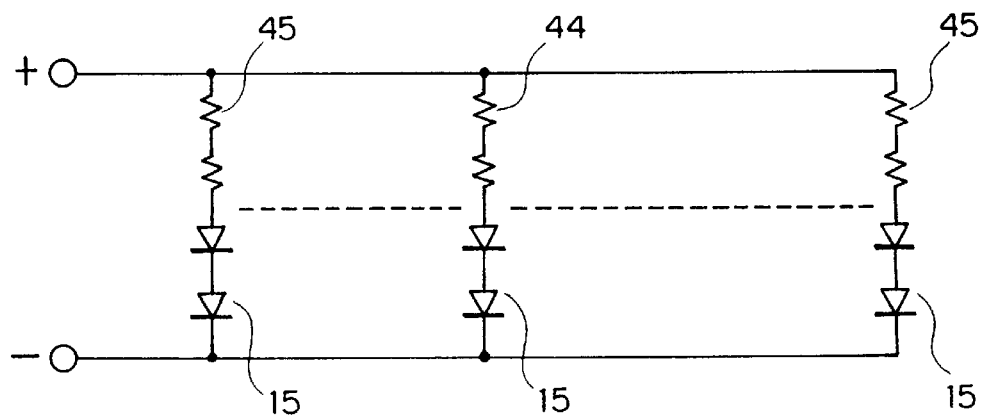
FIG. 24 is a circuit diagram showing a line light source of an image sensor according to a seventeenth embodiment of the present invention.

FIG. 24 is a circuit diagram showing a line light source of an image sensor according to a seventeenth embodiment of the present invention. In the figure, a line light source comprises a plurality of photo diodes 15 arranged linearly which are connected parallel to each other with respect to the power source, and a plurality of resistors 44 and 45 connected in series of two to the photo diodes 15, respectively. The resistors 45 connected to the photo diodes 15 located at both ends in the longitudinal direction of the line light source have a lower electrical resistance value than the resistors 44 connected to the photo diodes 15 located at the center in the longitudinal direction thereof.

In such an arrangement of the image sensor, as the resistors 45 at both ends have a lower electrical resistance value, the current flowing through the photo diode 15 at both ends is made higher than the current that flows to the other photo diodes 15. As a result, the amount of light illuminated from the photo diodes 15 at both ends becomes larger than that from the other photo diodes 15. Accordingly, deterioration in the illumination at both ends in the longitudinal direction of the line light source can be avoided.

Eighteenth Embodiment

Figure 25:
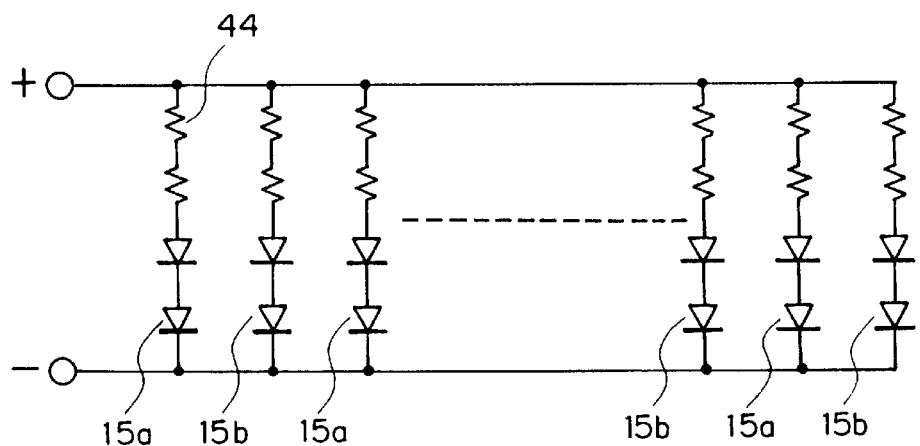
FIG. 25 is a circuit diagram showing a line light source of an image sensor according to an eighteenth embodiment of the present invention.
Figure 26:
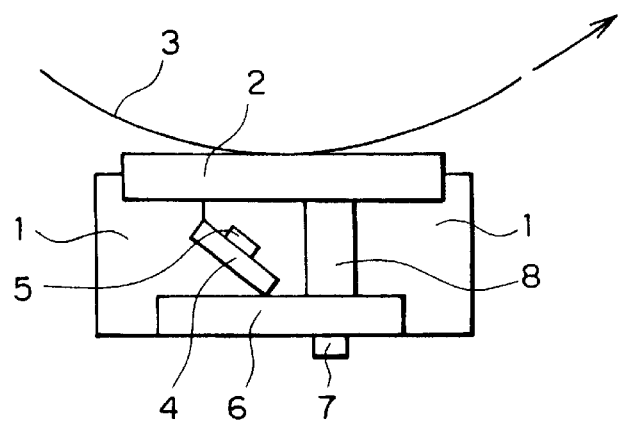
FIG. 26 is a block diagram showing an example of a conventional image sensor.

FIG. 25 is a circuit diagram showing a line light source of an image sensor according to an eighteenth embodiment of the present invention. In the figure, a line light source comprises a plurality of first photo diodes 15*a* and a plurality of second photo diodes 15*b* serving as the point light emitting elements that are linearly arranged and connected in parallel to each other with respect to the power source, and a plurality of resistors 44 connected in series by two to these photo diodes 15*a* and 15*b*, respectively. The first and second photo diodes 15*a* and 15*b* are alternately arranged and have a different light emitting wavelength from each other.

In such an arrangement of the-image sensor, these photo diodes 15*a* and 15*b* having different light emitting wavelengths are alternately arranged, so that colors unable to be read can be eliminated. That is, when the photo diode 15 has a light emitting wavelength for green, for example, green colored images cannot normally be recognized. On the other hand, according to the eighteenth embodiment of the present invention, the photo diodes 15*a* and 15*b* have different light emitting wavelengths. For this reason, an image including the same color as the light emitting wavelength of the photo diode 15*a* can be recognized by the light emitted from the photo diode 15*b*. Therefore images including any color can be recognized.

Incidentally, a line light source having a plurality of photo diodes 15 is demonstrated in the above embodiment, however, any other single light source serving as a line light source also may be employed alternatively.

It should also be noted that the original copy positioning member is not limited to a roller, and a sliding member sliding along the surface of the original copy 11, for example, may be employed alternatively.

It is, therefore, evident that there has been provided in accordance with the present invention, a package that fully satisfies the aims and advantages heretofore mentioned. While this invention has been described in conjunction with the preferred embodiments thereof, it is evident that many alternatives, modifications and variations will be apparent to those skilled in the art. Accordingly, it is intended to embrace all such alternatives, modifications, and variations that fall within the spirit and broad scope of the appended claims.

What is claimed is:

1. An image sensor employed for a portable image inputting device comprising:
   a handy scanner housing which moves on an original copy;
   a frame fitted to said housing and including a plurality of engaging portions and a lens positioning surface;
   a line light source provided within said frame for emitting a light to illuminate the original copy;
   a substrate fixed to said frame;
   a light receiving element formed on said substrate for receiving light reflected from the original copy;
   a transparent plate fixed to said frame by being engaged with said engaging portions for passing light emitted from said line light source and the light reflected from the original copy;
   an optical image forming component fixed to said frame by being pressed against said lens positioning surface by said transparent plate for forming an image of the reflected light from the original copy onto said light receiving element; and
   an original copy positioning member provided at said housing, for defining the position of the original copy by contacting the original copy in such a manner that said transparent plate is spaced apart from and faces the original copy.

2. An image sensor as claimed in claim 1, wherein a positioning portion for positioning the frame with respect to the handy scanner housing is formed to project from a longitudinal end of said frame.

3. A image sensor as claimed in claim 1, wherein said transparent plate comprises a resin molding material.

4. An image sensor as claimed in claim 1, wherein said original copy positioning member includes a rotatable roller arranged opposite said substrate, with a recess formed in said frame, for accommodating a part of said roller.

5. An image sensor as claimed in claim 1, wherein said transparent plate further includes an abutting surface against which said optical image forming component abuts.

6. An image sensor as claimed in claim 1, wherein a connector for electrically connecting said substrate to an external apparatus projects from a longitudinal end of said frame.

7. An image sensor as claimed in claim 1, wherein said substrate has a thickness of 0.6 mm or more and is fixed on said frame by a plurality of screws, said screws for locating both longitudinal ends of said substrate being arranged within an area extending 20 mm from both ends of said light receiving element towards the longitudinal center of said substrate.

8. An image sensor as claimed in claim 1, wherein a plurality of claw portions hooked by said engaging portions are formed in said transparent plate at intervals in a longitudinal direction thereof.

9. An image sensor as claimed in claim 1, wherein said original copy positioning member includes a rotatable roller, with a roller supporting portion for supporting the axial ends of said roller mounted to said frame.

10. An image sensor as claimed in claim 1, wherein said substrate is positioned with respect to said frame by making the end surface of said substrate abut against said frame.

11. An image sensor as claimed in claim 1, wherein a positioning hole is formed on said substrate and an inserting portion inserted into said positioning hole is formed on said frame, said substrate being positioned by inserting said inserting portion into said positioning hole.

12. An image sensor as claimed in claim 1, wherein an exposed portion of a conductor pattern is formed on the surface of said substrate and said frame abuts against said exposed conductor pattern portion so that said substrate may be positioned with respect to said frame.

13. An image sensor as claimed in claim 1, wherein a gap is formed between a longitudinal end of said optical image forming component and said frame, said gap being filled with an adhesive which is then hardened.

14. An image sensor as claimed in claim 1, wherein said line light source includes a plurality of point light emitting elements linearly arranged, with ribs for partitioning light emitting elements adjacent to each other formed on the frame.

15. An image sensor as claimed in claim 14, wherein a color with reflectivity of 50% or more relative to an emitted light from the point light emitting element is used as a surface color of the rib.

16. An image sensor as claimed in claim 1, wherein said line light source includes a point light emitting element and a light guide member for carrying emitted light from said point light emitting element.

17. An image sensor as claimed in claim 1, wherein said line light source includes a plurality of point light emitting elements linearly arranged, wherein an interval for two point light emitting elements located at both ends in a longitudinal direction of said line light source is made to be smaller than the intervals of point light emitting elements located at centrally in the longitudinal direction thereof.

18. An image sensor as claimed in claim 1, wherein said line light source includes a plurality of point light emitting elements linearly arranged and connected in parallel to each other with respect to a power source and a plurality of resistors linearly arranged and connected in series to said point light emitting elements, respectively, the electrical resistance value of the resistors connected to the point light emitting elements located at both ends in a longitudinal direction of said line light source being made smaller than the electrical resistance value of the resistors connected to the point light emitting elements locating centerally in the longitudinal direction thereof.

19. An image sensor as claimed in claim 1, wherein said line light source includes a plurality of first and second point light emitting elements that are turned on at the same time, the light emitting wavelengths of said first and second point light emitting elements being different from each other.

* * * * *